(12) United States Patent
Wyatt

(10) Patent No.: US 7,812,677 B2
(45) Date of Patent: Oct. 12, 2010

(54) SYNTHESIZER CHARACTERIZATION IN REAL TIME

(75) Inventor: Michael Anthony Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 388 days.

(21) Appl. No.: 11/947,954

(22) Filed: Nov. 30, 2007

(65) Prior Publication Data

US 2009/0140816 A1 Jun. 4, 2009

(51) Int. Cl.
*H03L 7/00* (2006.01)

(52) U.S. Cl. .............................. 331/17; 331/16; 331/34; 331/177 R

(58) Field of Classification Search .................... 331/34, 331/16, 177 R, 17
See application file for complete search history.

(56) References Cited

U.S. PATENT DOCUMENTS

| | | | |
|---|---|---|---|
| 4,511,858 A | 4/1985 | Charavit et al. | |
| 5,170,130 A | 12/1992 | Ichihara | |
| 5,175,729 A | 12/1992 | Borras et al. | |
| 5,182,528 A | 1/1993 | Zuta | |
| 5,355,098 A | 10/1994 | Iwasaki | |
| 5,389,899 A * | 2/1995 | Yahagi et al. | 331/10 |
| 5,461,344 A | 10/1995 | Ando | |
| 5,686,918 A | 11/1997 | Uda | |
| 5,926,515 A | 7/1999 | Park | |
| 6,380,809 B1 | 4/2002 | Camp, Jr. | |
| 6,714,085 B1 | 3/2004 | Fette | |
| 2006/0256910 A1 | 11/2006 | Tal et al. | |
| 2007/0035347 A1 | 2/2007 | Sasaki | |

OTHER PUBLICATIONS

European Patent Office Communication dated Mar. 20, 2009 in Application No. 08170116.1.
European Patent Office Communication dated Mar. 20, 2009 in Application No. 08170116.1.

* cited by examiner

*Primary Examiner*—Arnold Kinkead
(74) *Attorney, Agent, or Firm*—RatnerPrestia

(57) ABSTRACT

A frequency synthesizer includes a phase locked loop (PLL) for generating a desired frequency. The PLL includes two loop filters. A characterization circuit is included, which is configured to receive a digital word for characterizing the PLL and provide a pre-charge value for pre-charging one of the loop filters to generate the desired frequency. A successive approximation analog to digital (A/D) converter is coupled between the loop filters and the characterization circuit, for providing both (a) the digital word to the characterization circuit, and (b) the pre-charge value to the selected loop filter. The digital word includes n-bits ranging in values from a most significant bit (MSB) to a least significant bit (LSB), and the pre-charge value is formed by the n-bits. The successive approximation A/D converter includes a successive approximation register (SAR) for forming the digital word, and a digital to analog (D/A) converter for forming the pre-charge value. The successive approximation A/D converter includes a comparator for comparing (a) a value corresponding to a loop filter voltage with (b) an analog value formed by a bit of the digital word.

19 Claims, 4 Drawing Sheets

SYNTHESIZER CHARACTERIZATION IN REAL TIME

FIELD OF THE INVENTION

The present invention relates, generally, to frequency synthesizers. More particularly, the present invention relates to systems and methods for characterizing a synthesizer in real-time and pre-positioning the synthesizer to a new frequency to reduce settling time.

BACKGROUND OF THE INVENTION

The use of fast hopping frequency synthesizers is well known in the art for applications such as frequency hopping spread spectrum (FHSS) transmitters and receivers. In most transceivers, the synthesized frequency source (i.e. the local oscillator (LO)) is used to create the carrier signal in the transmitter and to down convert the signal in the receiver.

Local oscillator signals are normally generated using a phase locked loop (PLL) coupled to a crystal oscillator that provides the frequency reference. The loop bandwidth of the PLL determines its settling rate, as well as some of the phase noise properties of the generated local oscillator signal. The underlying trade off is that lower loop bandwidths may provide lower phase noise by better rejecting the high frequency phase noise of the PLL oscillator, but at a cost of longer settling times.

Some frequency synthesizers rely on a programmable PLL to control a voltage controlled oscillator (VCO) that produces desired output frequencies. A conventional, non-prepositioned PLL-type frequency synthesizer includes a phase comparator, a loop filter, a VCO, and a frequency divider all arranged in a loop, and a reference frequency source. Such an arrangement is shown in FIG. 1, which is also disclosed in U.S. Pat. No. 4,511,858, issued to Charavit et al. on Apr. 16, 1985.

As disclosed therein, frequency synthesizer 7 includes voltage-controlled oscillator (VCO) 1 for delivering an output frequency $f_N$ which is dependent on the control voltage $V_N$ applied thereto. The output of VCO 1 is connected to a frequency-divider circuit 2 which delivers an output signal at the frequency $f_N/N$ applied to phase comparator 3 to which is also applied a reference frequency $f_{ref}$. Phase comparator 3 delivers a signal whose average component is proportional to the phase difference existing between the two input signals applied to phase comparator 3. A low-pass filter 4 is connected to the output of comparator 3 for removing high frequency components of the spectrum of the output signal of the phase comparator. Finally, optional amplifier 5 is placed between filter 4 and VCO 1 in order to provide the loop gain and buffering of the phase control loop of synthesizer 7.

Since the switching time of synthesizer 7 is inversely proportional to the bandwidth of the loop, the switching time is preferably reduced by increasing the bandwidth.

A method for increasing the bandwidth may be provided by use of frequency pre-positioning, an example of which is shown by frequency synthesizer 12 in FIG. 2 (also disclosed by Charavit et al.). Frequency synthesizer 12 includes VCO 1, divider circuit 2 for dividing the output frequency $f_N$ which is controlled by control device 11, phase comparator 3 and frequency discriminator 6.

The frequency discriminator delivers a voltage proportional to the difference in frequencies applied as inputs to frequency discriminator 6. When the compared frequencies are identical, the discriminator does not deliver a control voltage. Rather, the control voltage is delivered by phase comparator 3. A summing amplifier 7 receives the signals from comparator 3 and discriminator 6 and delivers a signal which is filtered by low-pass filter 8.

In order to minimize the frequency deviation to be compensated by the control loop after a frequency switchover, pre-positioning voltage generator 9 is added to the loop in such a manner, as to position the VCO 1 as close as possible to the frequency to be delivered at the time of the frequency switchover. The frequency-switching control device 11 produces action both on divider circuit 2 and on voltage generator 9. Voltage generator 9 delivers a voltage $V_{NP}$ which, combined by summing circuit 10 with the voltage $V_{NE}$ delivered by filter 8, constitutes the control voltage $V_N$ of VCO 1.

Disadvantages of frequency synthesizer 12 are that it does not provide a high accuracy of positioning the output frequency of the synthesizer and does not provide a high rate of stabilizing (settling) the output frequency.

Referring next to FIG. 3, there is shown pre-positioned frequency synthesizer 80 disclosed in U.S. Pat. No. 6,714,085, issued on Mar. 30, 2004 to Bruce Alan Fette. Synthesizer 80 includes a reference frequency signal source 12 from which a reference signal 14 oscillating at a reference frequency is supplied. Reference frequency signal source 12 couples to a reference frequency divider 16. Frequency divider 16 is configured to produce a divided reference signal 18 oscillating at the reference frequency divided by M. Divided reference signal 18 couples to a first input of phase comparator 20. An output of phase comparator 20 provides a phase-error signal 22 and couples to an input of loop filter 24, which is configured to influence the bandwidth of phase-locked loop (PLL) 26.

As shown, the loop filter includes resistor 28 and capacitor 30 coupled to ground reference 34. A control signal 32 drives an input of variable frequency oscillator 36, whose output provides synthesizer-output signal 38.

Synthesizer-output signal 38 drives frequency divider 40, which is configured to divide the frequency of synthesizer-output signal 38 by N, producing a divided synthesizer-output signal 42. Divided synthesizer-output signal 42 is provided to phase comparator 20.

Control signal 32 also drives pre-positioning circuit 44. Pre-positioning circuit 44 causes synthesizer 80 to hop to new frequencies and to settle at these new frequencies.

Specifically, control signal 32 is routed to an input of filter-state-recording circuit 46. Filter-state-recording circuit 46 measures and records the various states exhibited by loop filter 24 as synthesizer 80 hops from frequency to frequency.

Filter-state-recording circuit 46 includes an analog-to-digital (A/D) conversion circuit 48 and read/write memory 50. The output of A/D conversion circuit 48 also couples to an input of controller 52, and an output of controller 52 couples to an address input of memory 50. A data output of memory 50 serves as the output for filter-state-recording circuit 46 and couples to an input of compensation circuit 54.

Compensation circuit 54 has an output coupled to an input of filter-state-assigning circuit 56, and filter-state-assigning circuit 56 has an output that drives control signal 32 from time to time. During these driving times, filter-state-assigning circuit 56 assigns states to loop filter 24, which causes loop-filter capacitor 30 to charge or discharge to desired voltage levels.

Filter-state-assigning circuit 56 includes multiplexer (MUX) 58. The compensation circuit output couples to an input of multiplexer 58. Outputs from controller 52 also couple to multiplexer 58. An output of multiplexer 58 couples to an input of a digital-to-analog (D/A) conversion circuit 60, and an output of D/A conversion circuit 60 couples to switching device 62. Switching device 62 also couples to loop filter 24, variable frequency oscillator 36, and filter-state-recording circuit 46. A selection input of switching device 62 couples to an output from controller 52.

The A/D conversion circuit 48 and D/A conversion circuit 60 have the same resolution, typically in the range of 8-16 bits. Compensation circuit 54 compensates for response differences between filter-state-recording circuit 46 and filter-state-assigning circuit 56. The response differences are due to offset differences and linearity differences between A/D conversion circuit 48 and D/A conversion circuit 60.

Pre-positioning circuit 44 seeks to record a given state of loop filter 24 during an earlier hop period in which a given synthesizer-output frequency is generated. Then, during a later hop period occurring the next time that same synthesizer-output frequency is to be generated, pre-positioning circuit 44 seeks to assign that same state to loop filter 24. But due, at least in part, to the response differences between filter-state-recording circuit 46 and filter-state-assigning circuit 56 error is inevitably introduced while recording the state during the earlier hop period, and additional error is introduced in reproducing the recorded state for assignment to loop filter 24 during the later hop period. Thus, compensation circuit 54 is provided to compensate for these errors.

In addition, compensation circuit 54 adapts to the individual characteristics of filter-state-recording circuit 46 and filter-state-assigning circuit 56. The adaptation is accomplished through a training process, whereby controller 52 trains compensation circuit 54 when synthesizer 80 is initially energized and on additional occasions while synthesizer 80 remains energized.

As will be explained, the present invention provides improvements over the frequency synthesizers shown in FIGS. 2 and 3.

SUMMARY OF THE INVENTION

To meet this and other needs, and in view of its purposes, the present invention provides a frequency synthesizer including at least one phase locked loop (PLL) for generating a desired frequency. The one PLL includes a loop filter. Also included is a characterization circuit configured to receive a digital word for characterizing the one PLL and provide a pre-charge value for pre-charging the loop filter to generate the desired frequency. A successive approximation analog to digital (A/D) converter is coupled between the loop filter and the characterization circuit, for providing both (a) the digital word to the characterization circuit, and (b) the pre-charge value to the loop filter. The digital word includes n-bits ranging in values from a most significant bit (MSB) to a least significant bit (LSB), and the pre-charge value is formed by the n-bits. The characterization circuit includes a memory portion for providing a look-up table (LUT), and the pre-charge value is stored in the LUT.

The successive approximation A/D converter includes a successive approximation register (SAR) for forming the digital word, and a digital to analog (D/A) converter for forming the pre-charge value. The successive approximation A/D converter also includes a comparator for comparing (a) a value corresponding to the loop filter voltage in the PLL with (b) an analog value formed by a bit of the digital word. The loop filter voltage in the PLL is provided from a phase comparator disposed in the PLL, and the analog value is provided from the D/A converter.

The frequency synthesizer includes one PLL for generating first and second desired frequencies. The PLL includes first and second loop filters, and a set of switches for sequentially selecting the first and second loop filters for generating, respectively, the first desired frequency and the second desired frequency. During a first period, the characterization circuit is configured to pre-charge the first loop filter to a first pre-charge value, and during a second period, the characterization circuit is configured to pre-charge the second loop filter to a second pre-charge value.

The frequency synthesizer includes, during the first period, a successive approximation A/D converter is configured to provide a first digital word to characterize the second loop filter, and during the second period, the successive approximation A/D converter is configured to provide a second digital word to characterize the first loop filter.

Another embodiment of the invention is a frequency synthesizer having a phase locked loop (PLL) with first and second loop filters. Each loop filter is selectively coupled between a phase comparator and a voltage controlled oscillator (VCO). A characterization circuit is selectively coupled to the first or second loop filter, and configured to determine a loop filter voltage and provide a pre-charge value to pre-charge the first or second loop filter to a desired frequency. The first loop filter is coupled to the characterization circuit during a period of pre-charge of the second loop filter, and the second loop filter is coupled to the characterization circuit during another period of pre-charge of the first loop filter.

The frequency synthesizer includes a controller for selectively coupling the first or second loop filter between the phase comparator and the VCO, and selectively coupling the pre-charge value to the first loop filter or the second loop filter.

The first loop filter is predetermined to operate at a first frequency, the characterization circuit is configured to determine the loop filter voltage of the first frequency, and the pre-charge value is configured to pre-charge the first loop filter to the first frequency. The second loop filter is predetermined to operate at a second frequency, the characterization circuit is configured to determine the loop filter voltage of the second frequency, and the pre-charge value is configured to pre-charge the second loop filter to the second frequency.

The frequency synthesizer includes an analog to digital (A/D) converter, coupled to the characterization circuit, for providing a digital representation of a first or a second loop filter voltage in the PLL. A processor determines a pre-charge value corresponding to a desired frequency based on the first or the second loop filter voltage, and the processor stores the pre-charge value in a look-up table (LUT).

A comparator is included for comparing (a) an analog value corresponding to the loop filter voltage in the first loop filter or the second loop filter with (b) an analog value of a portion of a word formed by the D/A converter during a process of forming an entire word representing the loop filter voltage.

During a first period, the first loop filter is pre-charged by a pre-charge value for providing a first operational frequency. During a second period, the second loop filter is pre-charged by another pre-charge value for providing a second operational frequency. The first and second periods are sequential time periods.

It is understood that the foregoing general description and the following detailed description are exemplary, but are not restrictive, of the invention.

BRIEF DESCRIPTION OF THE FIGURES

The invention is best understood from the following detailed description when read in connection with the accompanying figures.

DETAILED DESCRIPTION OF THE INVENTION

Figure 1:
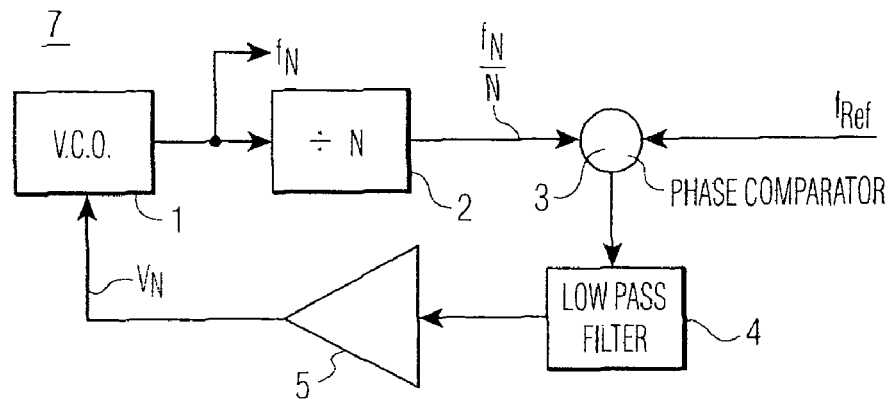
FIG. 1 is a conventional frequency synthesizer.
Figure 2:
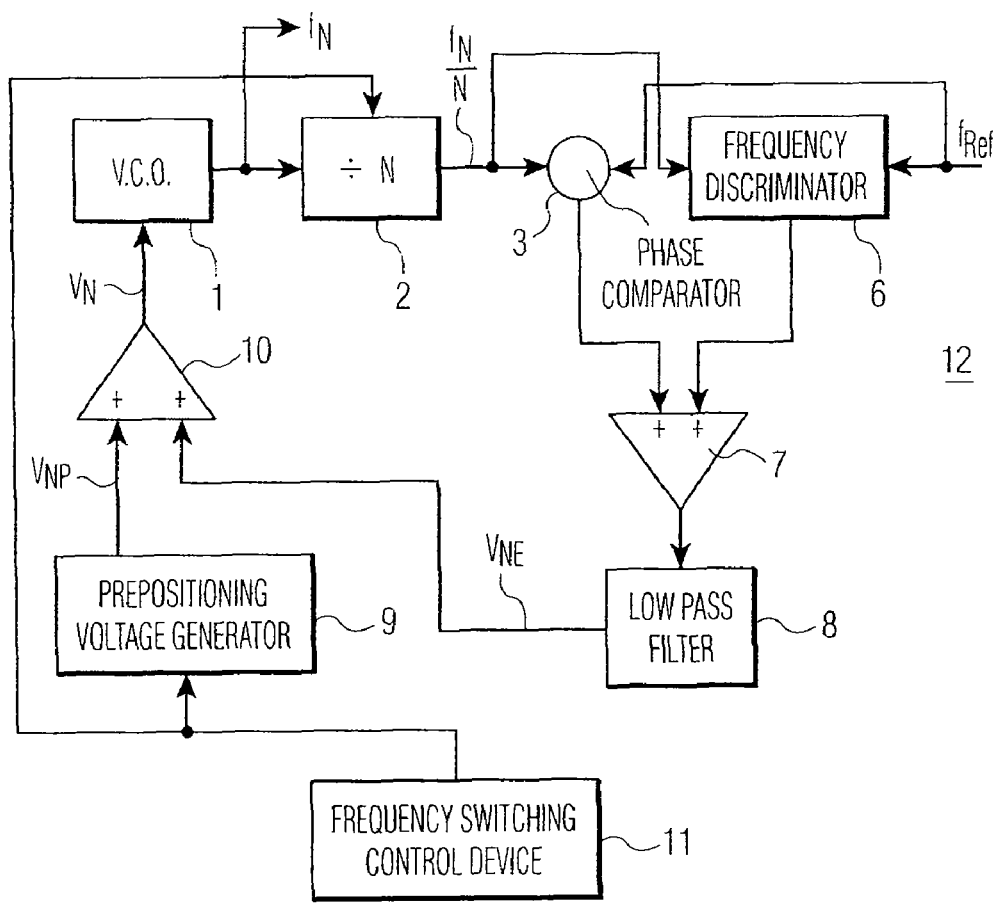
FIG. 2 is a conventional pre-positioned frequency synthesizer.
Figure 3:
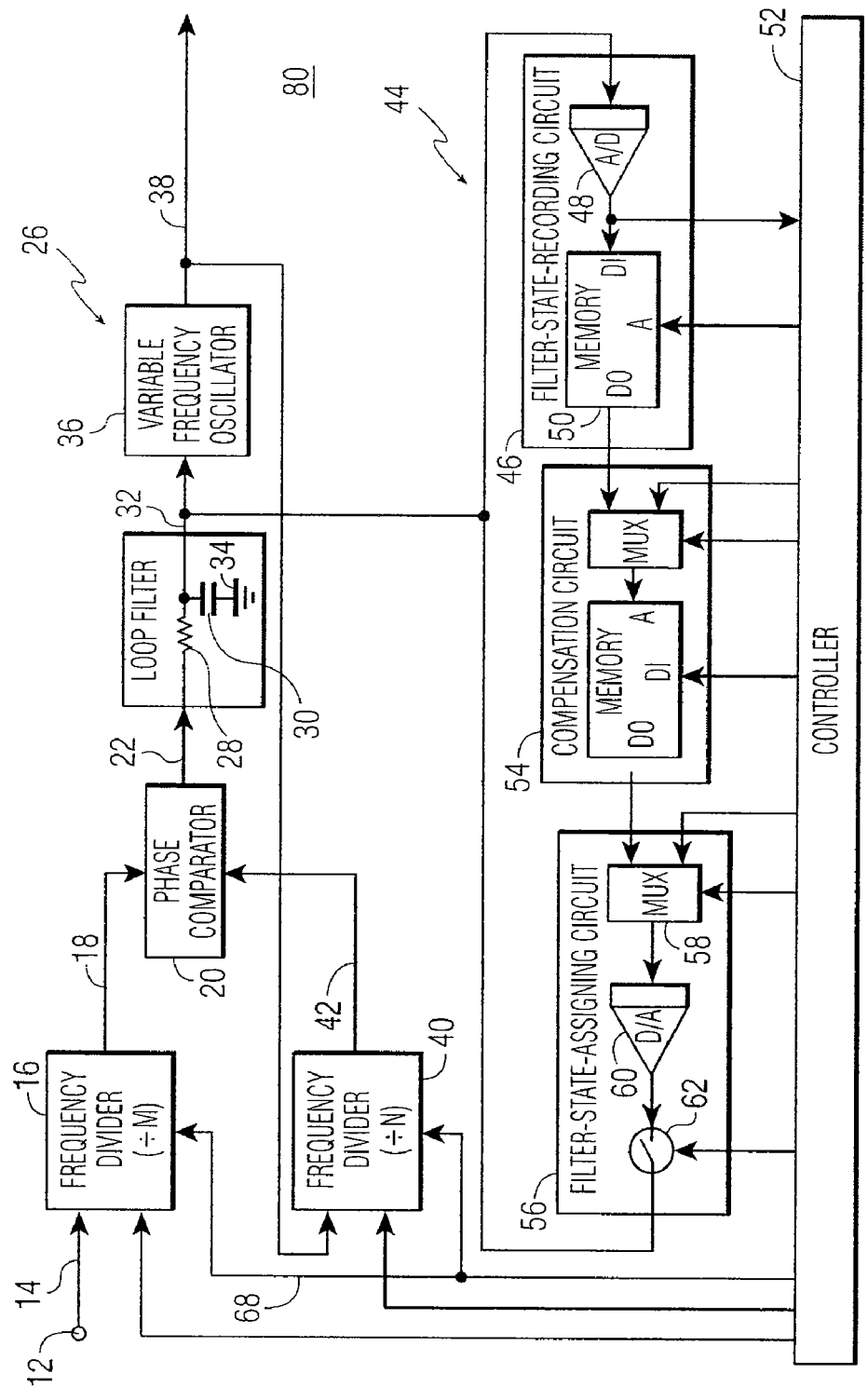
FIG. 3 is another conventional pre-positioned frequency synthesizer.
Figure 4:
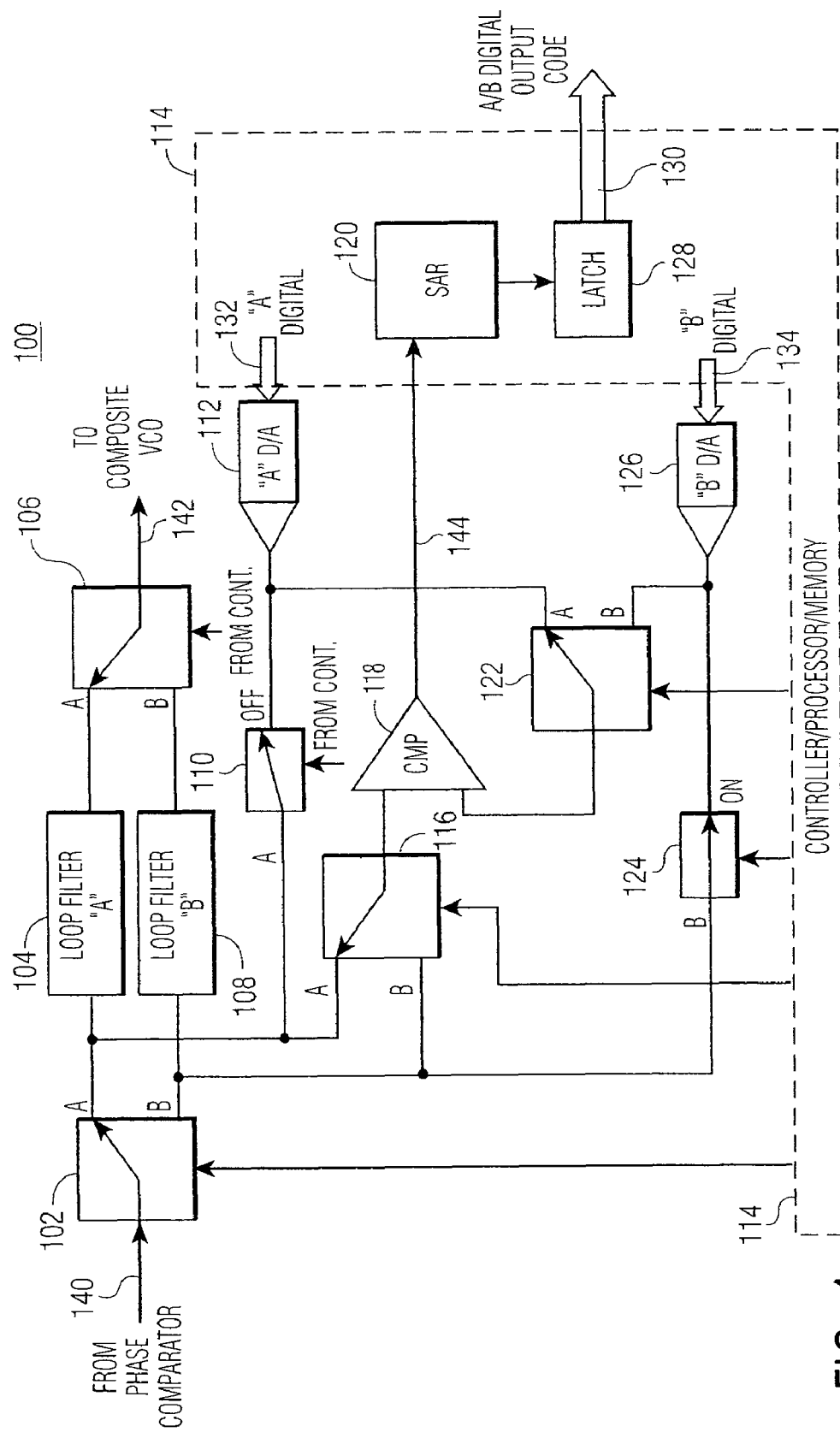
FIG. 4 is a pre-positioned frequency synthesizer, in accordance with an embodiment of the present invention.

FIG. 4 depicts a block diagram of a pre-positioned frequency synthesizer, generally designated as 100, in accordance with an embodiment of the present invention. Synthesizer 100 includes a set of switches 102, 106, 110, 116, 122 and 124. Switch 102 is coupled at the input side to a phase comparator, which may be similar to phase comparator 20 shown in FIG. 3. The output side of switch 106 is coupled to a composite voltage controlled oscillator (VCO) for producing the desired output frequencies. Sandwiched between switches 102 and 106 are loop filter A and loop filter B, respectively designated as 104 and 108.

Loop filter A is active, when the arms of switches 102 and 106 are each set to position A. Loop filter B is active, on the other hand, when the arms of switches 102 and 106 are each set to position B. As an example, when loop filter A is active the output of the composite VCO produces a frequency of $f_A$. When loop filter B is active, the composite VCO produces a frequency of $f_B$.

It will be appreciated that loop filter A and loop filter B are configured to influence the bandwidth of frequency synthesizer 100. The loop filters may be any one of a variety of loop filter topologies known in the phase-locked loop (PLL) arts. For example, the loop filters may include loop filter resistor 28 coupled in series with loop filter capacitor 30, as shown in FIG. 3. In addition, the VCO may be similar to variable frequency oscillator 36, as shown in FIG. 3, or may be a composite VCO operating in tandem.

Furthermore, although not shown, loop filter A and loop filter B are each part of a PLL that includes a feedback loop from the output of the composite VCO to an input of the phase comparator, usually through a frequency divider. In other words, the PLL may be similar to PLL 26 shown in FIG. 3. As shown, the output from variable frequency oscillator 36 loops back into one input of phase comparator 20 through divider 40. The other input of phase comparator 20 is provided from a reference oscillator, which provides reference frequency 12 on input line 14. The output of the phase comparator provides an error signal. As such, a phase error signal on line 140, shown in FIG. 4, drives either loop filter A or loop filter B. The resulting signal from loop filter A or loop filter B is output on line 142 and provided to the composite VCO to produce the desired frequency output.

Also shown in FIG. 4 are ON/OFF switches 110 and 124. Furthermore, switches 116 and 122 are similar to switches 102 and 106, each providing a selectable connection to either position A or position B. Each of the switches are controlled by a controller/processor, which may include an integrated memory or a separate memory, the controller/processor/memory being designated as 114. As will be explained, controller/processor/memory 114 includes a successive approximation register (SAR) 120, which converts an analog input signal into a digital output signal when utilized in conjunction with comparator 118 and either digital-to-analog (D/A) converter 112 or D/A converter 126 and provides the digital output signal onto bus 130, by way of latch 128.

It will be understood that comparator 118, D/A converter 112, D/A converter 126, SAR 120 and latch 128, together, form a successive approximation A/D converter. A digital bit (1 level, or 0 level) is provided to SAR 120 by way of output line 144 from comparator 118. Comparator 118 receives, at its first input port, a voltage from the input side of loop filter A or loop filter B (shown connected to loop filter A). At its second input port, comparator 118 receives, by way of switch 122, an analog signal from D/A converter 112. When switch 122 is connected to position B, however, comparator 118 receives, by way of switch 122, an analog signal from D/A converter 126.

Although D/A converters 112 and 126 are shown as two circuits that are separate from controller/processor/memory 114, it will be appreciated that all these circuits may be disposed in one integral circuit, such as controller/processor/memory 114. Furthermore, the two D/A converters 112 and 126 may be replaced by a single D/A converter having a multiplexed output, which is first connected to port A of switch 122 and, next, connected to port B of switch 122.

As shown, controller/processor/memory 114 may be implemented using any microprocessor, microcontroller, memory, timer, and like circuit managed by one or more computer programs to carryout various controlling processes. controller/processor/memory 114 may also include other latching and counting circuits, configured so that multiple events may be setup in advance, under control of a computer program, then clocked or synchronized to occur substantially simultaneously, or at a specified instance of time.

As known in the art, a successive approximation A/D converter approximates an analog signal to form an n-bit digital code (or word) in n-clock cycles. The successive approximation A/D converter compares, by way of comparator 118, an analog input voltage at a midpoint of one of n-ranges to determine the value of a single bit. Accordingly, comparator 118 compares the analog input voltage from the input side of loop filter A, or loop filter B to a voltage from D/A converter 112, or D/A converter 126, respectively, and provides a 1-bit value. This comparison process is repeated for a total of n-clock cycles, using n-ranges to determine the n-bits in the digital code (word).

The comparison process is accomplished as follows: comparator 118 determines if the analog input voltage is above or below the value output from D/A converter 112 and then sets the output of the comparator, on line 144, accordingly. The SAR 120 assigns the bits beginning with the most significant bit (MSB). The bit is set to a one, if the analog input voltage is greater than the D/A MSB voltage, as determined by comparator 118. On the other hand, the bit is set to a zero, if the analog input voltage is less than the D/A MSB voltage, as determined by comparator 118. The D/A bit is kept as a one, if the comparison is true (analog input is greater than D/A voltage); otherwise, it is set to zero. The SAR 120 then moves to the next bit and sets the bit to a 1 level or a 0 level, based on the results of the comparison by comparator 118. Because SAR 120 performs one approximation for each bit of the digital code, an n-bit code (or word) requires n-approximations. After completing the n-approximations, latch 128 produces the digital output code on line 130.

Still referring to FIG. 4, the output voltage of D/A converter 126 is provided as an input voltage to loop filter B, by way of switch 124, which is in the ON position. Similarly, the output voltage from D/A converter 112 is provided to the input side of loop filter A, when switch 110 is in the closed position (shown in the OFF position).

Although the output voltage from D/A converter 112 and the output voltage from D/A converter 126 are shown provided as voltages to the input sides of loop filter A and loop filter B, they may also be provided at the output sides of loop filter A and loop filter B. Similarly, the voltage provided into the input side of comparator 118 is shown arriving from the input side of loop filter A or loop filter B. It will be appreciated, however, that the voltage provided into the input side of comparator 118 may arrive from the output side of loop filter A or loop filter B.

Using the A/B digital output code (word), controller/processor/memory 114 characterizes the phase lock loop (PLL) including loop filter A and the PLL including loop filter B. In operation, frequency synthesizer 100 is shown with switches selecting the A state, where loop filter A controls the composite VCO to produce an output frequency of $f_A$. Accordingly, switches 102 and 106 are both in position A. There is no analog voltage provided from D/A converter 112, because switch 110 is in the OFF position. On the other hand, an analog voltage is provided from D/A converter 126, because switch 124 is in the ON position. The analog voltage from D/A converter 126 modifies the characteristics of loop filter B. In this manner, loop filter B is pre-charged and is readied for controlling the composite VCO to provide the desired output frequency of $f_B$.

During the A state, as shown, the voltage at the input side of loop filter A is provided to the first input side of comparator 118 by way of switch 116. The analog voltage from D/A converter 112 is provided to the second input side of comparator 118 by way of switch 122. If the voltage from loop filter A is greater than a voltage provided by D/A converter 112, then comparator 118 outputs a 1 level to SAR 120, as previously described. This is repeated for a number n of clock cycles, the number n depending on the resolution of SAR 120. After n-approximations, latch 128 provides a digital output word on line 130, corresponding to the voltage on line 140 from the phase comparator. The digital output word on line 130 is used to characterize loop filter A.

The characterization of the PLL may change over time, due to temperature changes and component aging changes. The new characterization of the PLL, including loop filter A, which is necessary to provide the desired frequency of $f_A$, may be stored in a look-up table (LUT) in the memory portion of controller/processor/memory 114.

After providing the output frequency $f_A$, controller/processor/memory 114 modifies the positions of all the switches to place synthesizer 100 in the B state. The modification is configured by switches 102, 106, 116 and 122 set to position B, and switch 110 set to the ON position and switch 124 set to the OFF position. In this manner, loop filter B, which was pre-charged during the A state, is ready to control the composite VCO, by way of line 142, to provide the desired output frequency of $f_B$. The analog voltage from D/A converter 112 is provided to pre-charge loop filter A to achieve the desired output frequency of $f_B$.

While loop filter A is pre-charging to provide the desired output frequency, comparator 118 receives the analog voltage from the input side of loop filter B and compares that voltage to an analog voltage from D/A converter 126. After n-clock cycles, SAR 120, by way of latch 128, produces a digital word corresponding to the analog voltage at the input side of loop filter B. This word is then used to characterize loop filter B. Once characterized, the desired voltage needed to precharge loop filter B may be stored in the look-up table (LUT).

This process is repeated by cycling sequentially between the A state (loop filter A of the PLL) and the B state (loop filter B of the PLL). While loop filter A and the VCO are being characterized and the synthesizer is operating at frequency $f_A$, loop filter B is being pre-charged and readied for the upcoming VCO frequency $f_B$.

Figure 5:
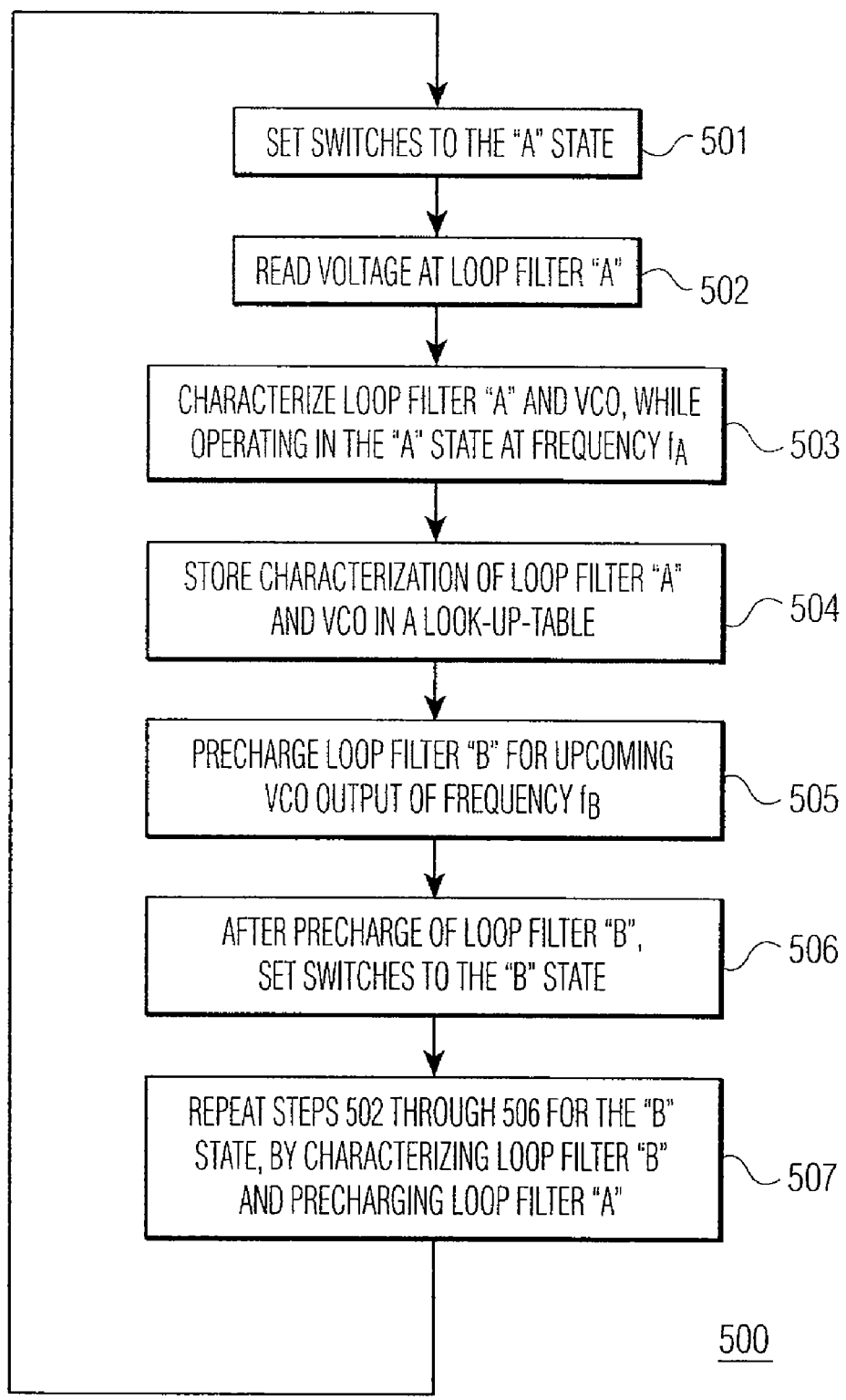
FIG. 5 is a method for pre-positioning the frequency synthesizer shown in FIG. 4, in accordance with an embodiment of the present invention.

Referring now to FIG. 5, there is shown a method for real-time synthesizer characterization of a frequency synthesizer, the method designated by 500. Beginning at step 501, all the switches are set to the A state. The A state includes switches 102, 106, 116 and 122 set to position A; switch 110 set to the OFF position; and switch 124 set to the ON position.

At step 502, controller/processor/memory 114 reads the voltage or signal at the input side of loop filter A. At step 503, the controller/processor/memory characterizes the PLL, which includes loop filter A and the VCO. At step 504, the characterization value of loop filter A and the VCO are stored in a look-up table in the controller/processor/memory 114.

In step 505, while the VCO is still operating to provide frequency output $f_A$, loop filter B is pre-charged and readied for the upcoming VCO output frequency $f_B$. After the pre-charging of loop filter B, step 506 sets the switches to the B state. The B state is configured by switches 102, 106, 116, and 122 set to position B; switch 110 set to the ON position; and switch 124 set to the OFF position. The composite VCO is now ready to provide the desired output frequency of $f_B$.

During operation of the synthesizer using loop filter B to provide output frequency $f_B$, loop filter B is also being characterized in a manner similar to steps 502 through 506. This is summarized by step 507. Method 500 loops back to the beginning of step 501 and the process repeats by switching to the A state and then switching to the B state, and so on.

It will now be appreciated that frequency synthesizer 100 is an improvement over frequency synthesizer 80 shown in FIG. 3. Because frequency synthesizer 100 uses (1) a successive approximation A/D converter to provide a digital word and (2) the D/A converter(s), which is part of the successive approximation A/D converter, to provide the analog voltage for pre-charging the loop filters, the circuitry of synthesizer 100 is less complicated then the circuitry of synthesizer 80.

The synthesizer 80 requires both an A/D converter (48 in FIG. 3) and a D/A converter (60 in FIG. 3). As a result, synthesizer 80 requires matching components during fabrication between A/D converter 48 and D/A converter 60. Furthermore, due to mismatches still existing between the two converters, synthesizer 80 requires compensation circuit 54 for compensating any mismatches between A/D converter 48 and D/A converter 60.

Synthesizer 100 of the present invention, however, does not have such complications. Furthermore, synthesizer 100 is effective in providing more hopping frequencies during a fixed period, than conventional synthesizers are capable of providing during the same fixed period. This is due to frequency synthesizer 100 providing an output frequency by way of one loop filter, while the other loop filter is being pre-charged to the next desired frequency.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A frequency synthesizer comprising
   at least one phase locked loop (PLL) for generating a desired frequency,
   the one PLL including a loop filter,
   a characterization circuit configured to receive a digital word for characterizing the one PLL and provide a pre-charge value, and a successive approximation analog to digital (A/D) converter, coupled between the loop filter and the characterization circuit, for receiving the pre-charge value and providing both (a) the digital word to the characterization circuit, and (b) the pre-charge value to the loop filter to generate the desired frequency, wherein the digital word includes n-bits ranging in values from a most significant bit (MSB) to a least significant bit (LSB), and the pre-charge value is formed by the n-bits.

2. The frequency synthesizer of claim 1 wherein
the characterization circuit includes a memory portion for providing a look-up table (LUT), and the pre-charge value is stored in the LUT.

3. The frequency synthesizer of claim 1 wherein
the successive approximation A/D converter includes a successive approximation register (SAR) for forming the digital word, and a digital to analog (D/A) converter for forming the pre-charge value.

4. The frequency synthesizer of claim 3 wherein
the successive approximation A/D converter includes a comparator for comparing (a) a value corresponding to a loop filter voltage with (b) an analog value formed by a bit of the digital word.

5. The frequency synthesizer of claim 4 wherein
the loop filter voltage is provided from a phase comparator disposed in the PLL, and
the analog value is provided from the D/A converter.

6. The frequency synthesizer of claim 5 wherein
an input side of the loop filter is coupled to the phase comparator, and
the loop filter voltage is provided to the input side of the loop filter.

7. The frequency synthesizer of claim 5 wherein
an input side of the loop filter is coupled to the phase comparator, and
the loop filter voltage is provided from an output side of the loop filter.

8. The frequency synthesizer of claim 1 including
the one PLL for generating first and second desired frequencies,
the one PLL including, respectively, first and second loop filters, and
a set of switches for sequentially selecting the first and second loop filters for generating, respectively, the first desired frequency and the second desired frequency,
wherein during a first period, the characterization circuit is configured to pre-charge the first loop filter to a first pre-charge value, and
during a second period, the characterization circuit is configured to pre-charge the second loop filter to a second pre-charge value.

9. The frequency synthesizer of claim 8 wherein
during the first period, the successive approximation A/D converter is configured to provide a first digital word to characterize the second loop filter, and
during the second period, the successive approximation A/D converter is configured to provide a second digital word to characterize the first loop filter.

10. A frequency synthesizer having a phase locked loops (PLL) comprising
first and second loop filters disposed in the PLL, each loop filter selectively coupled between a phase comparator and a voltage controlled oscillator (VCO), a characterization circuit, selectively coupled to the first or second loop filter, configured to determine a loop filter voltage and provide a pre-charge value to pre-charge the first or second loop filter to a desired frequency,
wherein the first loop filter is coupled to the characterization circuit during a period of pre-charge of the second loop filter, and
the second loop filter is coupled to the characterization circuit during another period of pre-charge of the first loop filter.

11. The frequency synthesizer of claim 10 including
a controller for selectively coupling the first or second loop filter between the phase comparator and the VCO, and
the controller for selectively coupling the pre-charge value to the first loop filter or the second loop filter.

12. The frequency synthesizer of claim 10 wherein
the first loop filter is predetermined to operate at a first frequency,
the characterization circuit is configured to determine the loop filter voltage of the first frequency, and
the pre-charge value is configured to pre-charge the first loop filter to the first frequency.

13. The frequency synthesizer of claim 10 wherein
the second loop filter is predetermined to operate at a second frequency,
the characterization circuit is configured to determine the loop filter voltage of the second frequency, and
the pre-charge value is configured to pre-charge the second loop filter to the second frequency.

14. The frequency synthesizer of claim 10 including
at least one digital to analog (D/A) converter, coupled between the characterization circuit and the first or second loop filter, for providing the pre-charge value to the first or second loop filter.

15. The frequency synthesizer of claim 10 including
an analog to digital (A/D) converter, coupled to the characterization circuit, for providing a digital representation of a first or a second loop filter voltage in the PLL.

16. The frequency synthesizer of claim 15 wherein
a processor determines a pre-charge value based on the first or the second loop filter voltage, and
the processor stores the pre-charge value in a look-up table (LUT).

17. The frequency synthesizer of claim 14 including
a comparator for comparing (a) an analog value corresponding to the loop filter voltage in the first loop filter or the second loop filter with (b) an analog value of a portion of a word formed by the D/A converter during a process of forming an entire word representing the loop filter voltage.

18. The frequency synthesizer of claim 10 wherein
during a first period, the first loop filter is pre-charged by a pre-charge value for providing a first operational frequency,
during a second period, the second loop filter is pre-charged by another pre-charge value for providing a second operational frequency, and
the first and second periods are sequential time periods.

19. The frequency synthesizer of claim 10 including
a successive approximation A/D converter having a successive approximation register (SAR) for forming a digital word of the loop filter voltage, and a D/A converter for forming the pre-charge value.

* * * * *